United States Patent
Ito

(10) Patent No.: US 6,583,442 B2
(45) Date of Patent: *Jun. 24, 2003

(54) LIGHT EMITTER DEVICE AND A METHOD FOR MANUFACTURING THE SAME

(75) Inventor: Shigetoshi Ito, Nara (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/402,493

(22) PCT Filed: Mar. 25, 1998

(86) PCT No.: PCT/JP98/01355

§ 371 (c)(1),
(2), (4) Date: Sep. 30, 1999

(87) PCT Pub. No.: WO98/44569

PCT Pub. Date: Oct. 8, 1998

(65) Prior Publication Data

US 2002/0121637 A1 Sep. 5, 2002

(30) Foreign Application Priority Data

Mar. 31, 1997 (JP) .............................................. 9-079300

(51) Int. Cl.[7] .......................... H01L 27/15; H01L 33/00
(52) U.S. Cl. .............................. 257/79; 257/99; 257/88
(58) Field of Search ................ 257/99, 79, 88

(56) References Cited

U.S. PATENT DOCUMENTS

| | | | | |
|---|---|---|---|---|
| 5,696,389 A | * | 12/1997 | Ishikawa et al. | 257/99 |
| 5,751,013 A | * | 5/1998 | Kidoguchi et al. | 257/13 |
| 5,767,581 A | * | 6/1998 | Nakamura et al. | 257/749 |
| 6,107,644 A | * | 8/2000 | Shakuda et al. | 257/79 |
| 6,180,960 B1 | * | 1/2001 | Kusuda et al. | 257/91 |

FOREIGN PATENT DOCUMENTS

| | | | |
|---|---|---|---|
| JP | 407030153 A | * | 1/1995 |
| JP | 07-288340 A | | 10/1995 |
| JP | 08-102550 A | | 4/1996 |
| JP | 09-08250769 | | 9/1996 |
| JP | 09-064418 A | | 3/1997 |
| JP | 09-064477 A | | 3/1997 |
| JP | 409167858 A | * | 6/1997 |

OTHER PUBLICATIONS

Ponce et al, Nitride–based semiconductors for blue and green light–emitting devices, Mar. 1997, Nature/vol. 386, pp. 351–359.*

* cited by examiner

Primary Examiner—Eddie Lee
Assistant Examiner—Joseph Nguyen
(74) Attorney, Agent, or Firm—Morrison & Foerster LLP

(57) ABSTRACT

A light emitter including a substrate, at least one semiconductor layer of a first conductivity type formed on the substrate, at least one semiconductor layer of a second conductivity type formed on a partial region of the semiconductor layer of the first conductivity type, a first bonding electrode connected to the semiconductor layer of the first conductivity type and a second bonding electrode connected to an almost entire surface of the semiconductor layer of the second conductivity type, wherein the substrate is transparent to light emitted from a proximity of a junction between the semiconductor layer of the first conductivity type and the semiconductor layer of the second conductivity type, the second bonding electrode is formed to have an almost rectangular shape and a substantially minimum area for bonding, and sides of the emitter are disposed in three directions of the circumstance of the second bonding electrode.

9 Claims, 7 Drawing Sheets

LIGHT EMITTER DEVICE AND A METHOD FOR MANUFACTURING THE SAME

TECHNICAL FIELD

The present invention relates to a light emitter and a method for manufacturing the same.

BACKGROUND ART

In recent years, semiconductor light emitters such as LEDs which emit light in a range from ultraviolet to visible light have been realized by using nitride semiconductor materials typified by GaN, AlN, InN or a mixed crystal thereof.

These LEDs mainly utilize a sapphire substrate which is an insulator as a substrate. Therefore, different from ordinary light emitters, the LED is required to have both p-type and n-type electrodes on its surface and various structures have been proposed for this purpose.

A conventional light emitter using a nitride semiconductor material will be detailed with reference to FIGS. 7(a) and 7(b).

In a light emitter shown in FIGS. 7(a) and 7(b), an n-GaN layer 2, an InGaN light emitting layer 3, a p-GaN layer 4 and a p-transparent electrode 6 are sequentially formed on a sapphire substrate 1. As regards the n-Gan layer 2, in a partial region thereof, a part of the surface of thereof is removed together with the InGaN light emitting layer 3 and the p-GaN layer 4 which are formed thereon. An n-bonding electrode 5 is directly connected to the region. Further, a p-bonding electrode 7 is connected on a partial region of the p-transparent electrode 6. Moreover, balls 8 and bonding wires 9 are connected to the n-bonding electrode 5 and the p-bonding electrode 7.

In such a structure that both the p- and n-electrodes are drawn from a surface of a device, electric current basically flows in parallel directions with interfaces of semiconductor layers in the device. Therefore, electric current flowing from a p-type layer through the light emitting layer to an n-type layer hardly flows evenly through each part of the light emitting layer. As a result, distribution of light emission intensity in a light emitting portion tends to be wide-spread.

To cope with this problem, the p-electrode may be formed on an almost entire surface of the light emitting layer 3. In order to let emitted light out of the light emitting layer 3, the p-electrode must be a transparent electrode. Accordingly, there is no choice but to use an extremely thin film, for example, a metal film of about 10 nm in thickness. However, it is difficult to bond wires on such an extremely thin film. Therefore, in the above-described light emitter, the p-transparent electrode 6 is formed as the p-electrode and the p-bonding electrode 7 which has enough thickness and is opaque is formed on a part thereof However, in the above-described light emitter, even though the layered structure thereof is contrived so that the emitted light can be taken out from an upper surface of the light emitter, it is still difficult to let out the light emitted just under the opaque p-bonding electrode 7. That is, even if the p-transparent electrode 6 is provided on the entire surface of the light emitting layer 3, the light emitted just under the p-bonding electrode 7 cannot be taken out because it is blocked by the p-bonding electrode 7. Therefore, it is a problem that an improvement in letting out the emitted light is not brought about.

DISCLOSURE OF THE INVENTION

According to the present invention, provided is a light emitter comprising:

a substrate, at least one semiconductor layer of a first conductivity type formed on the substrate, at least one semiconductor layer of a second conductivity type formed on a partial region of the semiconductor layer of the first conductivity type, a first bonding electrode connected to the semiconductor layer of the first conductivity type, and a second bonding electrode connected to an almost entire surface of the semiconductor layer of the second conductivity type, the light emitter being characterized in that the substrate is transparent to light emitted from a proximity of a junction between the semiconductor layer of the first conductivity type and the semiconductor layer of the second conductivity type, the second bonding electrode is formed to have an almost rectangular shape and a substantially minimum area for bonding, and sides of the emitter are disposed in three directions of the circumference of the second bonding electrode.

Further, according to the present invention, provided is a light emitter provided with;

a substrate, at least one semiconductor layer of a first conductivity type formed on the substrate, at least one semiconductor layer of a second conductivity type formed on a partial region of the semiconductor layer of the first conductivity type, a first bonding electrode connected to the semiconductor layer of the first conductivity type, and a second electrode connected to an almost entire surface of the semiconductor layer of the second conductivity type, the light emitter being characterized in that the substrate is transparent to a light emitted from a proximity of a junction between the semiconductor layer of the first conductivity type and the semiconductor layer of the second conductivity type, the second electrode includes a second bonding electrode and a second transparent electrode, the second bonding electrode is formed to have an almost rectangular shape and a substantially minimum area for bonding, and sides of the emitter are disposed in three directions of the circumference of the second bonding electrode.

Still further, according to the present invention, provided is a process for manufacturing a light emitter comprising:

forming at least one semiconductor layer of a first conductivity type, at least one semiconductor layer of a second conductivity type, a first bonding electrode and a second bonding electrode, in plural numbers in a longitudinal and a transverse direction on a substrate, the semiconductor layers of the first conductivity type and of the second conductivity type and the first and second bonding electrodes being to constitute a plurality of light emitters; and separating the resulting substrate into units of light emitters, wherein the semiconductor layers and the electrodes are disposed in such a manner that, in the longitudinal direction, the first bonding electrodes are in juxtaposition with each other and the second bonding electrodes are in juxtaposition with each other, and in the transverse direction, the first bonding electrodes are adjacent to the second electrodes.

BRIEF DESCRIPTION OF THE DRAWINGS

FIG. 1(a) is a schematic plan view and FIG. 1(b) is a schematic sectional view.

FIG. 5(a) is a schematic plan view and FIG. 5(b) is a schematic sectional view.

FIG. 6(a) is a schematic plan view and FIG. 6(b) is a schematic sectional view.

FIG. 7(a) is a schematic plan view and FIG. 7(b) is a schematic sectional view taken along the line A–A" in FIG. 7(a).

DESCRIPTION OF THE PREFERRED EMBODIMENTS

Figure 1A:
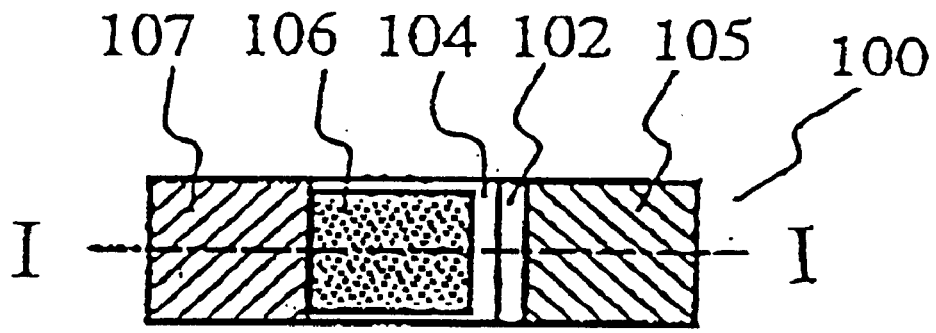
FIGS. 1(a) and 1(b) illustrate a light emitter of the present invention.

The light emitter of the present invention is mainly comprised of a semiconductor layer of a first conductivity type, a semiconductor layer of a second conductivity type, a first bonding electrode and a second bonding electrode formed on a substrate, or is mainly comprised of a semiconductor layer of a first conductivity type, a semiconductor layer of a second conductivity type, a first bonding electrode and a second electrode formed on a substrate.

The substrate is not particularly limited as long as it is used commonly as a substrate for a light emitter, but needs to be transparent to light emitted from the light emitter to be obtained, that is, its absorption of light having wavelengths near the wavelength of the emitted light needs to be small enough as compared with its transmission. For example, it can be selected from semiconductor substrates such as of silicon, germanium and the like, compound semiconductor substrates such as of SiGe, SiC, GaP, GaAsP, GaN and the like, and dielectric substrates such as of sapphire, quartz, ZnO and the like depending on the wavelength of the emitted light.

The semiconductor layer of the light emitter according to the present invention is comprised of at least one semiconductor layer of the first conductivity type and the second conductivity type to form at least one pn junction. The first conductivity type and the second conductivity type referred herein signify any of p-type, n-type or i-type.

These semiconductor layers may be formed of semiconductors having the same composition or semiconductors having different compositions. There may also be intermediate layers or buffer layers of the first conductivity type, of the second conductivity type or of a conductivity type different from these two types between the substrate and these semiconductor layers, between the semiconductor layers, between the semiconductor layers and the first bonding electrode or the second electrode.

Examples of the semiconductor include nitride semiconductors of group III, that is, gallium nitride semiconductors such as $In_sAl_tGa_{1-s-t}N$ ($0 \leq s$, $0 \leq t$, $s+t \leq 1$), as well as $Al_sGa_{1-s}As$ ($0 \leq s \leq 1$), $Ga_sAs_{1-s}P$ ($0 \leq s \leq 1$), $In_sGa_{1-s}As_xP_{1-x}$ ($0 \leq s \leq 1$, $0 \leq x \leq 1$), $In_sAl_tGa_{1-s-t}P$ ($0 \leq s$, $0 \leq t$, $s+t \leq 1$), $In_sAl_tGa_{1-s-t}N_xAs_{1-x}$ ($0 \leq s$, $0 \leq t$, $s+t \leq 1$, $0 \leq x \leq 1$), $In_sAl_tGa_{1-s-t}N_xP_{1-x}$ ($0 \leq s$, $0 \leq t$, $s+t \leq 1$, $0 \leq x \leq 1$) and $Mg_sZn_tCd_{1-s-t}S_xSe_yTe_{1-x-y}$ ($0 \leq s$, $0 \leq t$, $s+t \leq 1$, $0 \leq x$, $0 \leq y$, $x+y \leq 1$). Among them, gallium nitride semiconductors, particularly $In_sAl_tGa_{1-s-t}N$ ($0 \leq s$, $0 \leq t$, $s+t \leq 1$), are preferable.

These semiconductor layers may or may not contain impurities of n-type or p-type, for example, C, Si, Ge, Sn, Be, Zn, Cd, Hg, Mg, 0, S, Se, Te or the like in a concentration of about $1 \times 10^{14}$ to $1 \times 10^{21}$ cm$^{-3}$.

The semiconductor layers can be formed by a known method such as an MOCVD (organic metal chemical vapor deposition) method, an MBE (molecular beam epitaxy) method, an MOMBE method, a GSMBE (gas source molecular beam epitaxy) method or the like. Further, the impurities may be doped simultaneously with the forming of the semiconductor layers or may be doped by an ion implantation or a thermal diffusion method after the semiconductors are formed.

The semiconductor layer of the first conductivity type has an exposed region to which the first bonding electrode to be described later is connected, preferably with a surface layer of the region being removed. As to the size of the region to which the first bonding electrode is connected, it may have an area required for bonding, for example, about 50–300× 50–300 $\mu$m$^2$ or about 5–50% of the whole area of the semiconductor layer of the first conductivity type for composing one light emitter. Further, the thickness of the removed surface layer may be about 0.5–10 $\mu$m or about 10–70% of the whole thickness of the semiconductor layer of the first conductivity type.

As a method for partially removing the surface of the semiconductor layer of the first conductivity type, known methods can be used. Specifically, a wet etching method using a mask having an opening only in a region to be partially removed and an acid solution or an alkali solution, an RIE (reactive ion etching) method using various kinds of gas or the like can be mentioned. For example, the RIE method using a gas containing a halogen element is effective for nitride semiconductors of group III and in particular, Cl$_2$ gas and SiCl$_4$ gas can be used.

The semiconductor layer of the second conductivity type is formed only on a partial region of the semiconductor layer of the first conductivity type. The size thereof can be suitably adjusted according to the light emission intensity and the like of the light emitter to be finally obtained. For example, about 30–90% of the whole area of the semiconductor layer of the first conductivity type can be mentioned.

The semiconductor layer of the second conductivity type can be formed in the same manner as that of the first conductivity type. In the case of processing it into a desired shape, it can be realized by the same manner as the method for partially removing the semiconductor layer of the first conductivity type as described above.

Incidentally, each of these semiconductor layers is preferably formed into a rectangular shape because the outward shape of an LED chip is usually rectangle. In the present application, the "rectangular shape" includes a square shape, a trapezoid shape, a parallelogram shape in addition to the rectangular shape and further includes these shapes with a part or all of the edges thereof being rounded, i.e., a shape near a semicircle, a shape near a semioval and the like so that these semiconductor layers can be disposed without wasting space in the LED chip.

The first bonding electrode of the light emitter according to the present invention is an electrode formed on the semiconductor layer of the first conductivity type and can be formed with a common conductive material. Examples thereof include Al, In, Ga, Ni, Ti, Cu, Au, Ag, Cr, Si, W, WN, Pt, Pd, Ta, Sr and the like. These materials may be formed into a single layer film or a layered film of Ti/Au, W/Au and the like. The thickness thereof is not particularly limited, but for example, about 0.5 cm or more, preferably about 1 $\mu$m or more to 10 $\mu$m or less are mentioned. It may be of any size as long as it has an area required for bonding. For example, 50–300×50–300 $\mu$m$^2$ can be mentioned as described above. The shape thereof is not particularly limited, but a rectangular shape is preferable.

A method for forming the first bonding electrode can be suitably selected taking materials to be used into consideration. For example, usable are a sputtering method, a vacuum deposition method, an EB deposition method, an ion plating method, an MBE method, a plating method, a screen printing method and the like.

The first bonding electrode is usually provided with a wire for external electrical connection. Further, a ball may be provided so that the first bonding electrode is firmly connected with the wire. The wire and ball can be formed of generally used materials.

The second electrode of the light emitter according to the present invention is an electrode formed on an almost entire surface of the semiconductor layer of the second conductivity type.

For example, (1) in the case where the second electrode is formed only for bonding with the semiconductor layer of the second conductivity type, it can be formed in the same manner with the same materials into the same thickness as described above. In this case, the second electrode is preferably formed to have a substantially minimum area for bonding, for example, about 50–300×50–300 $\mu$m$^2$, preferably about 100–200×100–200 $\mu$m$^2$, or about 20–90% of the whole area of the semiconductor layer of the first conductivity type for composing one light emitter. This second electrode is preferably formed into a rectangular shape or an almost rectangular shape. The thickness thereof may be about 0.5–10 $\mu$m, for example. Further, the second electrode may preferably be formed in such a manner that sides of the light emitter are disposed in three directions of the circumference of the second electrode, i.e., just under or almost just under three sides of the second electrode including an opposite side to a side nearest to the first bonding electrode and two sides adjacent to the opposite side.

Further, (2) in the case where the second electrode is formed for bonding with and applying current to the semiconductor layer of the second conductivity type, the second electrode is composed of a second bonding electrode and a second transparent electrode. In this case, the second bonding electrode can be formed in the same manner with the same materials into the same thickness as described above. The second electrode in this case is preferably formed into a substantially minimum area for bonding as same as in the above (1), for example, about 50–300×50–300 $\mu$m$^2$, about 5–60% of the whole area of the semiconductor layer of the first conductivity type for composing one light emitter, or about 10–90% of the whole area of the semiconductor layer of the second conductivity type. The second bonding electrode may preferably be formed into a rectangular shape or an almost rectangular shape. Further, the second bonding electrode may preferably formed in such a manner that sides of the light emitter are disposed in three directions of the circumference of the second bonding electrode, i.e., just under or almost just under three sides of the second bonding electrode including an opposite side to a side nearest to the first bonding electrode and two sides adjacent to the opposite side.

The second transparent electrode is electrically connected with the second bonding electrode and may be formed from just under the second bonding electrode to cover an almost entire surface of the semiconductor layer of the second conductivity type, or may be formed so as not to overlap the second bonding electrode except for securing the minimum contact with the second bonding electrode.

The second transparent electrode is formed of an electrode material allowing an efficient take-out of the light emitted from the light emitter. Its light transmissivity to the emitted light is preferably about 30–100%, for example. As the electrode material, for example, metals such as Al, Au, Ni, Pd, Ti, Cr, Ta, Pt, Sr and the like, transparent conductive materials such as SnO$_2$, ZnO, ITO and the like can be used. These materials may be formed into either a single layer film or a layered film. The thickness thereof can be suitably adjusted so that a proper light transmissivity is provided when the above materials are used, for example, preferably about 20 nm or less, more preferably about 15 nm or less. On the other hand, in order to uniform current in a transverse direction on the surface of the semiconductor layer, resistance in a transverse direction of the light transmitting electrode itself needs to be small enough as compared with that of the semiconductor layer. Therefore, the thickness thereof is preferably about 2 nm or more. Specifically, in the case where a layered film of Ni/Au, Pd/Pt or the like is used, the thickness in the range of about 1–10 nm/1–10 nm is preferable. Further, where a single layer of Pt is used, the thickness is preferably in the range of about 2–20 nm, more preferably, in the range of about 2–10 nm.

A method for forming the second transparent electrode can be suitably selected taking materials to be used into consideration. Examples thereof include a sputtering method, a vacuum deposition method, an EB method, an ion plating method, an MBE method and the like.

In this case, when it is viewed planarily, for example, the first bonding electrode, the second transparent electrode and the second bonding electrode which are formed in an almost square shape may preferably be disposed in a row.

Further, according to the method for forming the above-described light emitter, each light emitter is not formed individually, but a plurality of the light emitter is formed in a lump, preferably. That is, at least one semiconductor layer of the first conductivity type, at least one semiconductor layer of the second conductivity type, the first bonding electrode and the second electrode are formed in plural numbers to constitute a plurality of light emitters, in the longitudinal and transverse directions on the substrate. Then, the obtained substrate is divided by the unit light emitter or, if required, by two or more unit light emitters. In this case, the semiconductor layers and the electrodes are preferably arranged in such a manner that the first bonding electrodes are in juxtaposition with each other and the second electrodes are in juxtaposition with each other in the longitudinal direction and the first bonding electrodes are adjacent to the second bonding electrodes in the transverse direction. In the case where the second electrode is comprised of the second bonding electrode and the second transparent electrode, the first bonding electrodes are preferably disposed adjacently to the second bonding electrodes in the transverse direction.

Further, in the longitudinal direction, the first bonding electrodes and the second electrodes may be formed separately in juxtaposition, but a plurality of first bonding electrodes or a plurality of second electrodes may be formed into one-piece.

The plural light emitters formed into one-piece as described above may be divided by a known method such as a scribing method, a dicing method, a laser cutting method or the like.

According to the scribing method, the substrate is adjusted to about 50–200 $\mu$m in thickness, and then the wafer is scribed with a diamond point and divided into chips along scribed grooves. According to the dicing method, the substrate is adjusted to about 100–500 $\mu$m in thickness, then the wafer is cut by a rotary blade made of solidified diamond-ground particles and divided into chips. According to the laser cutting method, a $CO_2$ laser, an excimer laser or a YLF laser can be used and a KrF excimer laser having a wavelength of 248 nm may be used for cutting a sapphire substrate.

Hereinafter, embodiments of the light emitter of the present invention and the method for manufacturing the same will be described with reference to the drawings, but the present invention is not limited to these embodiments.

Embodiment 1

Figure 1B:
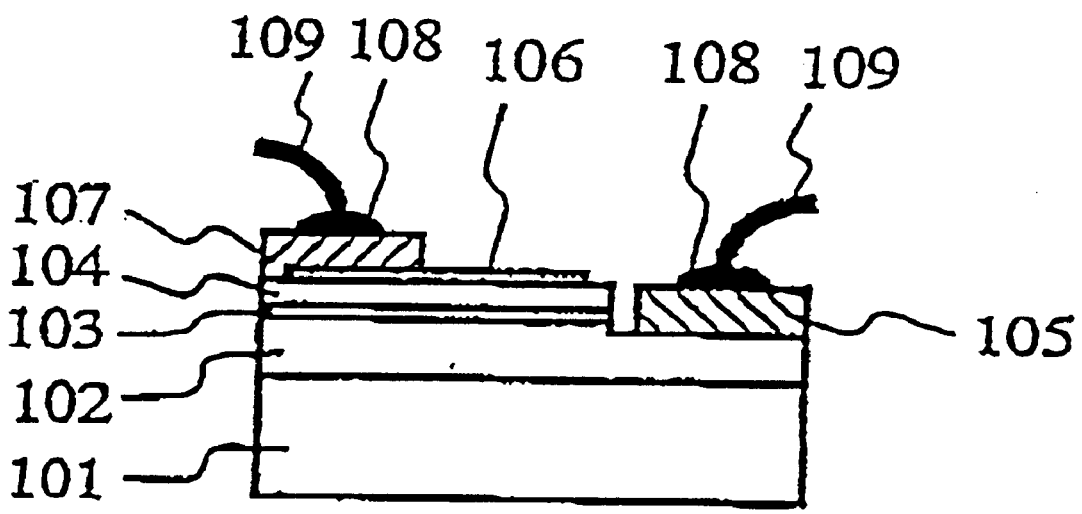

A blue light emitter of this embodiment is shown in FIGS. 1(a) and 1(b). In this light emitter 100, an n-GaN layer 102, an InGaN light emitting layer 103 and a p-GaN layer 104 are sequentially formed on a sapphire substrate 101 which hardly absorbs visible light and is transparent to the wavelength of light emitted by this light emitter. In a partial region thereof, the surface of the n-GaN layer 102 is partially removed together with the InGaN light emitting layer 103 and the p-GaN layer 104 formed thereon and an n-bonding electrode 105 is directly connected to the region. A p-bonding electrode 107 is connected to a partial region of a p-transparent electrode 106. Further, balls 108 and bonding wires 109 are connected to the n-bonding electrode 105 and the p-bonding electrode 107.

In this light emitter 100, the n-bonding electrode 105, the p-transparent electrode 106 and the p-bonding electrode 107 are disposed in a row. Incidentally, in FIG. 1(a), the balls 108 and the bonding wires 109 are omitted for easy understanding.

A method for forming the above-described light emitter is shown below.

First, the n-GaN layer 102, the InGaN light emitting layer 103 and the p-GaN layer 104 are sequentially laminated on the sapphire substrate 101 of 300 $\mu$m in thickness.

Then, the p-GaN layer 104, the InGaN light emitting layer 103 and a partial surface of the n-GaN layer 102 are removed in the region where the n-bonding electrode 105 will be formed in a later step by a photolithography technique and a dry etching technique.

Next, the p-transparent electrode 106 of a Ni/Au film having a thickness of about 15 nm is formed on the p-GaN layer 104. In this case, the size of the p-transparent electrode 106 is about 150×350 $\mu m^2$. Then, the n-bonding electrode 105 of an Al film having a thickness of about 1 $\mu$m is formed on the n-GaN layer 102.

Further, the p-bonding electrode 107 of an Au film having a thickness of about 1 $\mu$m is formed on the p-transparent electrode 106. This p-bonding electrode 107 is specially provided because wires are not easily bonded to the p-transparent electrode 106 of an extremely thin metal film. The size of the p-bonding electrode 107 is required to be as small as possible taking the efficiency in letting out the emitted light into consideration, so that it is formed into a square shape with a side of 200 $\mu$m.

Figure 2:
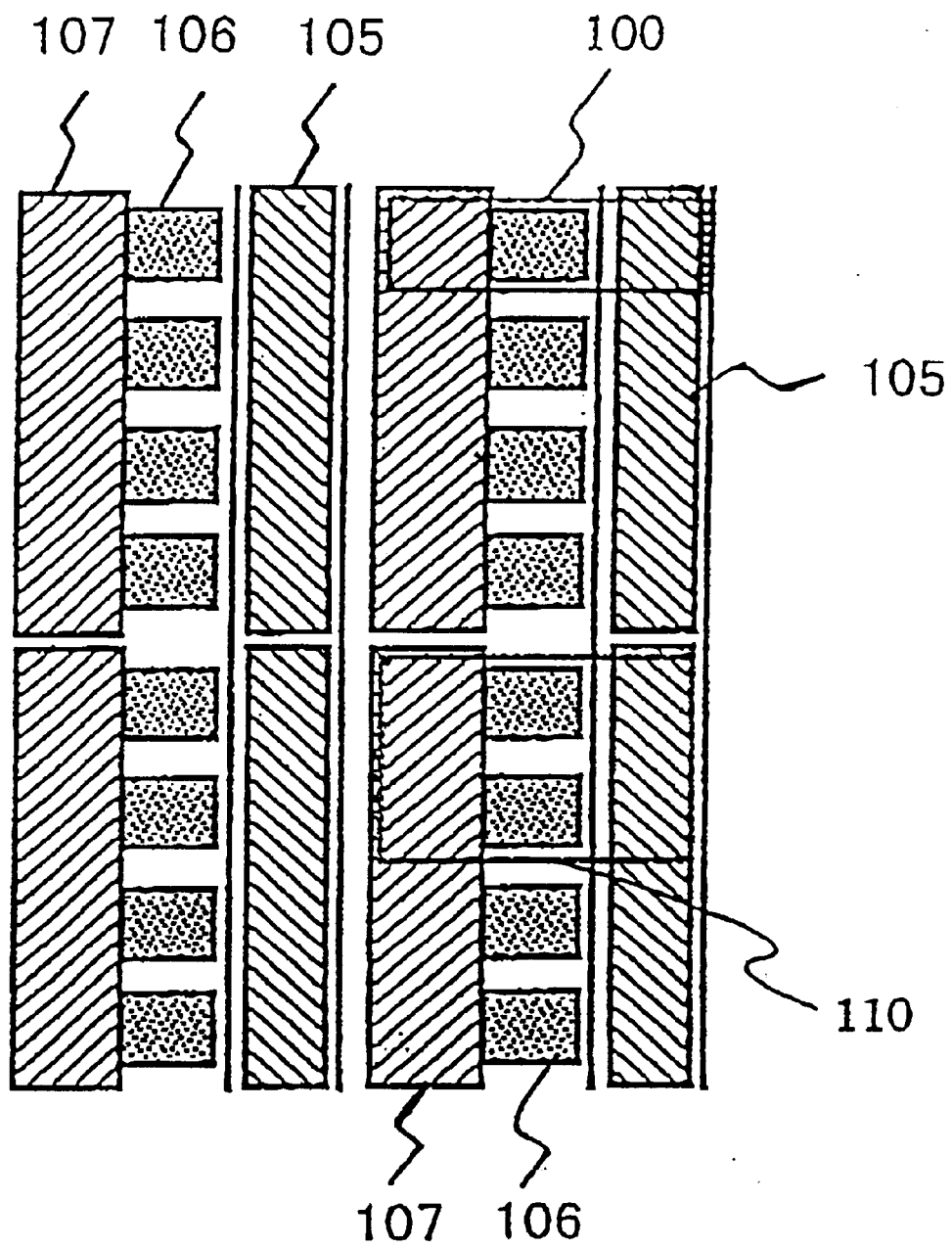
FIG. 2 is a schematic plan view illustrating a disposition of light emitters of the present invention on a wafer in a process for manufacturing the same.

Such steps are usually conducted in a lump to a plurality of light emitters as shown in FIG. 2. That is, the bonding electrodes 105 and 107 are formed jointly in plural numbers, and then divided into light emitters 100 as units.

Before dividing into the light emitters 100, a characteristic test for the light emitters 100 is performed on the substrate 101. This is a step for testing whether desired characteristics are obtained with regard to an emitter voltage, light emission intensity and the like by applying a probe to the p-bonding electrode 107 and the n-bonding electrode 105 to apply electric current as appropriate. In this embodiment, as shown in FIG. 2, a set of four light emitters 100 are formed to be joined to the bonding electrodes 105 and 107. Therefore, four light emitters can be tested in one time.

Moreover, according to the disposition as shown in FIG. 2, since the bonding electrodes 105 and 107 to which the probe is to be applied are disposed successively in line, the test can be performed only by sliding probes along the bonding electrodes 105 and 107 without damaging the p-transparent electrode 106 by mistake nor dropping dust and the like on the p-transparent electrode 106 from the probes, for example. Accordingly, the yield of the process is improved.

Additionally, in the longitudinal direction of FIG. 2, since strictness is not required to mask positioning for constituting the electrodes 105, 106 and 107 and the like of the light emitter, the production process is simplified.

In a later step, the light emitters shown in FIG. 2 are divided. The divided light emitters are lifted and transferred as required by a collet (a vacuum suction tool). In this case, if used is such a collet that only contacts both ends of the light emitter (the sides where the p-bonding electrode 107 and the n-bonding electrode 106 are formed respectively), both ends of the light emitter are fixed, which enables a stable transfer of the light emitter. Moreover, since only the bonding electrodes exist on both sides of the light emitter, a section for letting the emitted light out is not damaged. This is a specific effect of the light emitter of the present invention in which the n-bonding electrode, the p-transparent electrode and the p-bonding electrode are disposed in a row in this order so that only the bonding electrodes are disposed on both sides of the light emitter.

Then, each light emitter is fixed on a suitable pedestal which is not shown in FIG. 1 and bonding wires 109 are bonded onto the n-bonding electrode 105 and the p-bonding electrode 107. At this time, balls 108 are formed on the ends of the bonding wires 109, and thereby a firm wire bonding is completed.

In the above light emitter 100, as shown in FIG. 1(a), three of the four sides of the circumference of the square p-bonding electrode 107 consist sides of the light emitter 100. That is, at the three sides, sides of the light emitting layer 103 and the substrate 101 which is transparent to the emitted light are exposed. Therefore, the light emitted just under the p-bonding electrode 107 can be effectively taken out, which is not achieved sufficiently with the conventional light emitter.

Effect on the light emission efficiency by the disposition of the electrodes in the light emitter is experimented.

Figure 3:
FIG. 3 is a diagram illustrating a disposition of electrodes of light emitters to perform a comparative experiment on a radiative efficiency.

That is, as shown in FIG. 3, light emitters having their sides along three sides of the circumference of the p-bonding electrode 107 as in the above embodiment and light emitters having their sides along two sides of the circumference of the p-bonding electrode as shown in the conventional embodiment are formed with varying the area of the light emitting portions. Current having the same current density is applied and differences in the light emission intensity are compared.

The left column in FIG. 3 shows light emitters having their sides along three sides of the circumference of the p-bonding electrode. Supposing that the area of the p-bonding electrode is 1, shown are three types of light emitters whose light emitting portions have areas (the sum of the area of the p-bonding electrode and of the p-transparent electrode) of 1, 2 and 3. For example, it is shown that an emitter whose light emitting portion has an area of 1 is an emitter in which the transparent electrode is not formed, and that an emitter whose light emitting portion has an area of 2 is an emitter in which a transparent electrode having the same area as the p-bonding electrode is formed. Further, the right column shows the light emitter having their sides along two sides of the circumference of the p-bonding electrode. The area of the light emitting portion is same as the above. In this experiment, the size of the p-bonding electrode is fixed to a square shape having a side of 200 $\mu$m and a thickness of the sapphire substrate is fixed to 300 $\mu$m. An electric current of 10 mA per 1 area was applied.

Figure 4:
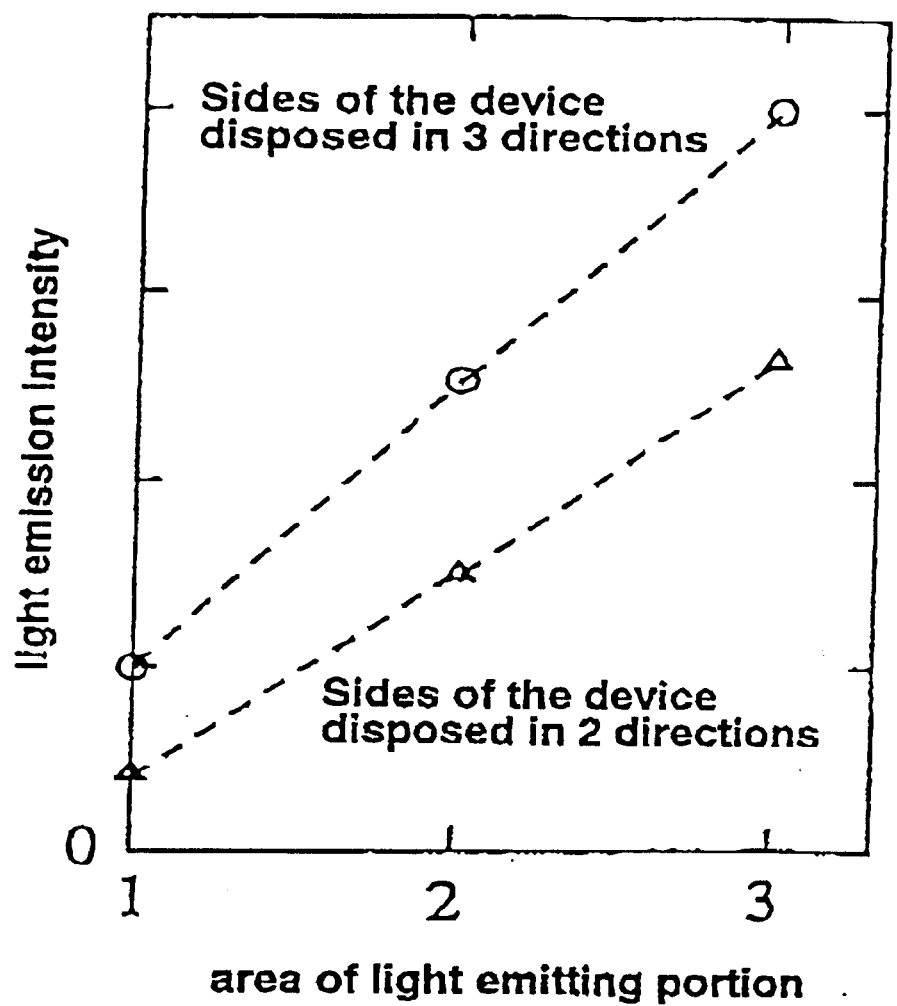
FIG. 4 is a graph illustrating a light emission intensity of each light emitter shown in FIG. 3.

The results are shown in FIG. 4. FIG. 4 relatively shows the light emission intensity of each light emitter shown in FIG. 3.

According to the results shown in FIG. 4, the light emitters having their sides along the three sides have greater light emission intensity than the light emitters having their sides along the two sides, independently of the area of the light emitting portion.

From the results, it is found that taking out the light emitted just under the p-bonding electrode is difficult even if the p-transparent electrode is provided adjacently to the p-bonding electrode and that the best way to improve the taking-out of light is to provide the sides of the circumference of the p-bonding electrode as emitter sides. Incidentally, such effect does not appear remarkably in a light emitter whose substrate is opaque to the emitted light. The reason is that the emitted light is absorbed in the substrate and semiconductor layers formed thereon when an opaque substrate is used, so that the light emitted just under the p-bonding electrode is hardly taken out. However, when a transparent substrate is used, the light emitted just under the p-bonding electrode can be taken out through sides of the substrate as far as the sides of the substrate are disposed at the circumference of the p-bonding electrode.

In addition, the results in FIG. 4 are hardly changed where the thickness of the substrate is in the range of 60–400 $\mu$m or where the size of the p-bonding electrode is in the suitable range of 100–200×100–200 $\mu$m$^2$.

The smaller the size of the p-bonding electrode is, the more desirable. However, it is necessary to ensure an area required for bonding. Further, the size of the light emitting portion needs to be properly set to prevent the applied current density from being excessive. The reason is that if the applied current density is excessive, the light emission efficiency may be deteriorated by generation of heat, or the life span of the emitter may be adversely influenced. Therefore, in the p-electrode formed to cover the light emitting portion, the minimum area required for bonding is for the p-bonding electrode and the rest of the area is used as the p-transparent electrode in order to secure a proper light emitting area. In addition, the p-transparent electrode is provided adjacently to only one side of the p-bonding electrode so as not to hinder the light emitted just under the p-bonding electrode from being taken out.

Thus, according to the light emitter of Embodiment 1, the area of the p-bonding electrode is minimized and three sides of the p-bonding electrode are disposed along the emitter sides, whereby the light emitted just under the p-bonding electrode can be effectively taken out of the light emitter, resulting in an improvement of the light emission efficiency of the light emitter compared with the conventional one.

Further, in this embodiment, since a nitride semiconductor of group III element is used for each semiconductor layer, a light emitter having favorable characteristics which emits light in the visible range can be obtained.

Further, in FIG. 2, when the light emitters are divided by a unit of two, i.e., as represented by 110, a light emitter having twice as large an area for the light emitting portion as usual one can be obtained.

Thus, according to the method for manufacturing the light emitter of this embodiment, light emitters having different areas for the light emitting portions can be obtained on one substrate only by partially changing the manufacturing process thereof.

Embodiment 2

Figure 5A:
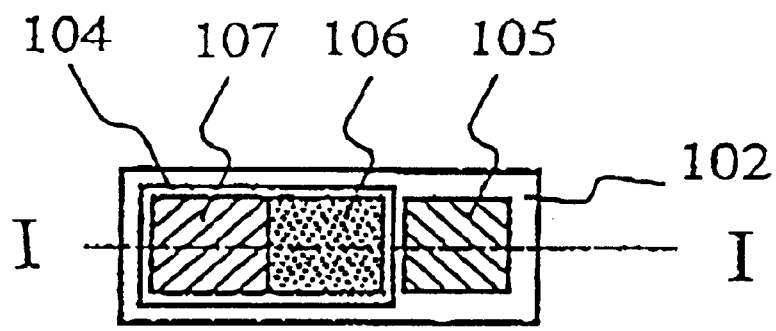
FIGS. 5(a) and 5(b) illustrate another light emitter of the present invention.
Figure 5B:
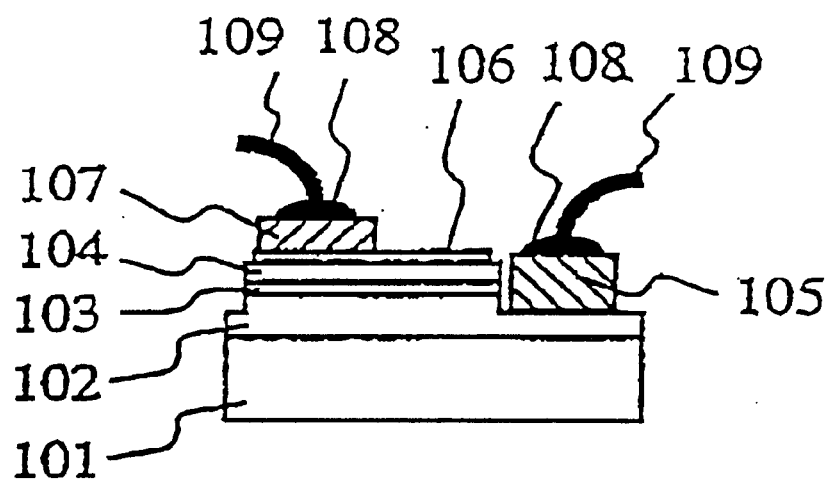

A green light emitter of this embodiment is shown in FIGS. 5(*a*) and 5(*b*). This light emitter is substantially the same as that of Embodiment 1 except that the p-bonding electrode 107 is formed about 30 □m side of sides of the emitter.

Further, in this embodiment, the sapphire substrate 101 is 100 $\mu$m thick, the p-transparent electrode 106 is a rectangular shape of 100×200 $\mu$m and the p-bonding electrode 107 is in a square shape with a side of 100 $\mu$m.

Even in the light emitter having such a structure, the light emitted just under the p-bonding electrode 107 can be effectively taken out, as in Embodiment 1. That is, a light emitter which emits light in the visible range and has a greater light emission efficiency compared with the conventional one is obtained.

Embodiment 3

Figure 6A:
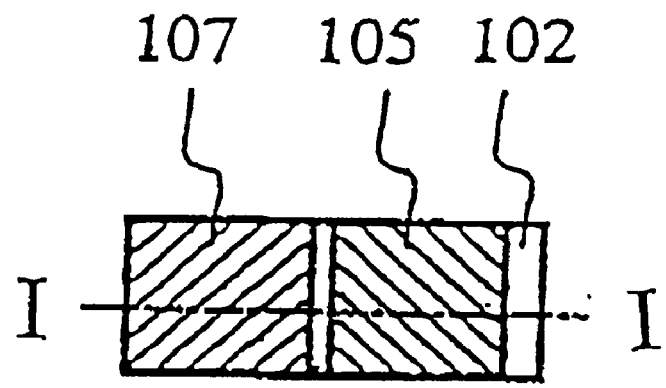
FIGS. 6(a) and 6(b) illustrate still another light emitter of the present invention.
Figure 6B:
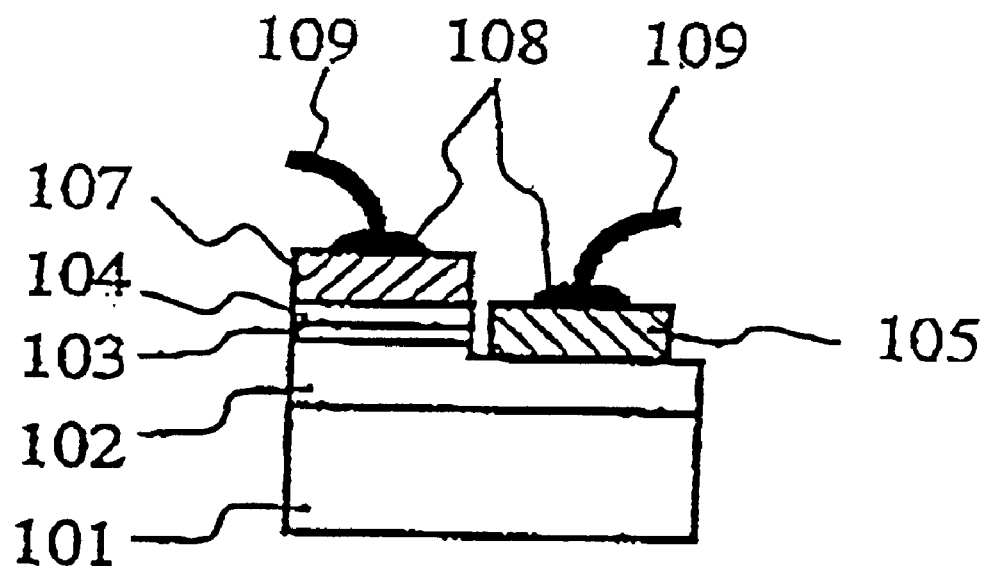
Figure 7A:
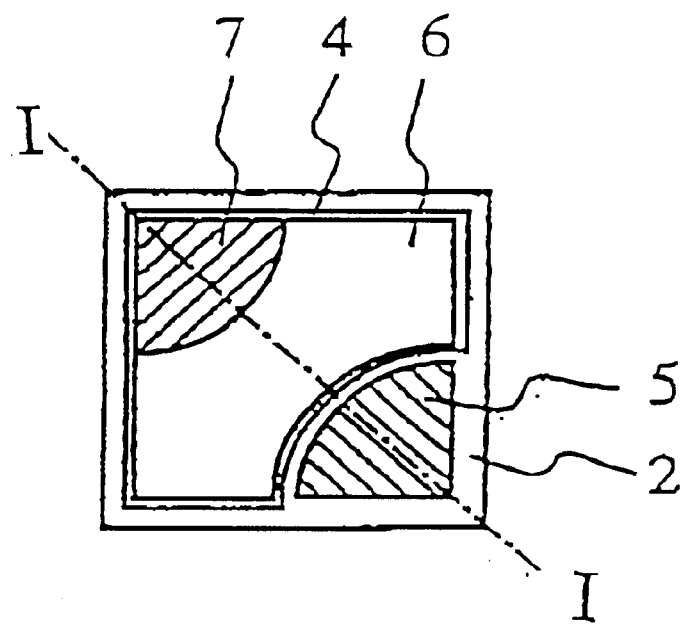
FIGS. 7(a) and 7(b) illustrate a conventional light emitter.
Figure 7B:
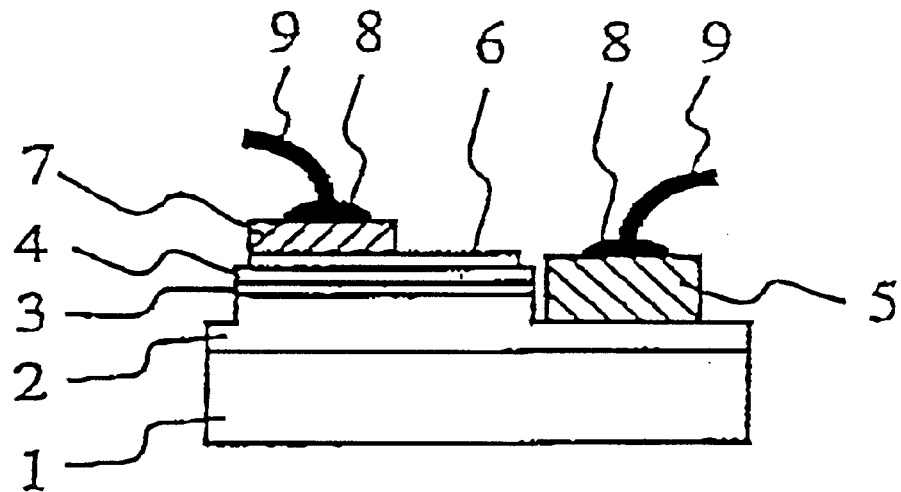

A yellowish green light emitter of this embodiment is shown in FIGS. 6(*a*) and 6(*b*). This light emitter is substantially the same as that of Embodiment 1 except that the p-transparent electrode is omitted.

Further, in this embodiment, the sapphire substrate 101 is 200 $\mu$m thick and the p-bonding electrode 107 is in a square shape with a side of 150 $\mu$m.

In the light emitter having such a structure, since the area for emitting light becomes smaller, there is a problem of degradation in characteristics such as deterioration of the light emission efficiency under high electric current. However, on the other hand, this light emitter can be utilized in an LED device intended for a low output operation under low electric current. Therefore, a light emitter even in such a simple configuration as shown in FIGS. 6(*a*) and 6(*b*) can be sufficiently used.

Accordingly, even in this light emitter, the light emitted just under the p-bonding electrode 107 can be effectively taken out from the emitter sides. Thus, the light emitter having sufficient characteristics, particularly aimed at a low output operation can be obtained.

According to the light emitter of the present invention, the light emitted just under the second electrode, which is not effectively utilized conventionally, can be taken out from the emitter sides at the maximum level, thereby improving the efficiency in letting the emitter light out.

Further, by disposing the semiconductor layers and the electrodes of the light emitter of the present invention in a suitable configuration, the light emitter can be formed in a convenient and easy manner.

What is claimed is:

1. A light emitter having a rectangular outside shape provided with;

a substrate, at least one semiconductor layer of a first conductivity type formed on the substrate, at least one semiconductor layer of a second conductivity type formed on a partial region of the semiconductor layer of the first conductivity type, a first bonding electrode connected to the semiconductor layer of the first conductivity type, and a second bonding electrode connected to an almost entire surface of the semiconductor layer of the second conductivity type, the light emitter being characterized in that the substrate is transparent to light emitted from a proximity of a junction between the semiconductor layer of the first conductivity type and the semiconductor layer of the second conductivity type, the second bonding electrode is formed to have an almost rectangular shape and a minimum area for bonding of about 50 to 300 micrometers in length and about 50 to 300 micrometers in width, and three sides of the second bonding electrode agree with three sides of the light emitter.

2. A light emitter having a rectangular outside shape provided with;

a substrate, at least one semiconductor layer of a first conductivity type formed on the substrate, at least one semiconductor layer of a second conductivity type formed on a partial region of the semiconductor layer of the first conductivity type, a first bonding electrode connected to the semiconductor layer of the first conductivity type, and a second electrode connected to an almost entire surface of the semiconductor layer of the second conductivity type, the light emitter being characterized in that the substrate is transparent to light emitted from a proximity of a junction between the semiconductor layer of the first conductivity type and the semiconductor layer of the second conductivity type, the second electrode comprises a second bonding electrode and a second transparent electrode, the second bonding electrode is formed to have an almost rectangular shape and a minimum area for bonding of about 50 to 300 micrometers in length and about 50 to 300 micrometers in width, and three sides of the second bonding electrode agree with three sides of the light emitter.

3. The light emitter according to claim 2, wherein the first bonding electrode, the second transparent electrode and the second bonding electrode are disposed in a row.

4. The light emitter according to claim 1, wherein the semiconductor layer of the first conductivity type and the semiconductor layer of the second conductivity type are formed of a nitride semiconductor of group III elements.

5. The light emitter according to claim 2, wherein the semiconductor layer of the first conductivity type and the semiconductor layer of the second conductivity type are formed of a nitride semiconductor of group III elements.

6. The light emitter according to claim 2, wherein the semiconductor layer of the first conductivity type and the semiconductor layer of the second conductivity type are formed of a nitride semiconductor of group III elements.

7. The light emitter according to claim 3, wherein the semiconductor layer of the first conductivity type and the semiconductor layer of the second conductivity type are formed of a nitride semiconductor of group III elements.

8. A light emitter which is an LED having a rectangular outside shape, the light emitter being provided with;

a substrate, at least one semiconductor layer of a first conductivity type formed on the substrate, at least one semiconductor layer of a second conductivity type formed on a partial region of the semiconductor layer of the first conductivity type, a first bonding electrode connected to the semiconductor layer of the first conductivity type, and a second bonding electrode connected to an almost entire surface of the semiconductor layer of the second conductivity type, the light emitter being characterized in that the substrate is transparent to light emitted from a proximity of a junction between the semiconductor layer of the first conductivity type and the semiconductor layer of the second conductivity type, the second bonding electrode is formed to have a minimum area for bonding of about 50 to 300 micrometers in length and about 50 to 300 micrometers in width, and the second bonding electrode is arranged to adjourn three sides of the outside shape of the LED.

9. A light emitter which is an LED having a rectangular outside shape, the light emitter being provided with;

a substrate, at least one semiconductor layer of a first conductivity type formed on the substrate, at least one semiconductor layer of a second conductivity type formed on a partial region of the semiconductor layer of the first conductivity type, a first bonding electrode connected to the semiconductor layer of the first conductivity type, and a second electrode connected to an almost entire surface of the semiconductor layer of the second conductivity type, the light emitter being characterized in that the substrate is transparent to light emitted from a proximity of a junction between the semiconductor layer of the first conductivity type and the semiconductor layer of the second conductivity type, the second electrode comprises a second bonding electrode and a second transparent electrode, the second bonding electrode is formed to have a minimum area for bonding of about 50 to 300 micrometers in length and about 50 to 300 micrometers in width, and the second bonding electrode is arranged to adjourn three sides of the outside shape of the LED.

* * * * *

UNITED STATES PATENT AND TRADEMARK OFFICE
CERTIFICATE OF CORRECTION

PATENT NO. : 6,583,442 B2  
DATED : June 24, 2003  
INVENTOR(S) : Shigetoshi ITO It is certified that error appears in the above-identified patent and that said Letters Patent is hereby corrected as shown below:

Column 3,
Line 28, please replace "line A-A" in" with -- line I-I" in --

Signed and Sealed this

Second Day of December, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,583,442 B2
DATED : June 24, 2003
INVENTOR(S) : Shigetoshi Ito

It is certified that error appears in the above-identified patent and that said Letters Patent is hereby corrected as shown below:

Column 12,
Lines 36 and 64, please replace "adjourn" with -- adjoin --.

Signed and Sealed this

Twentieth Day of September, 2005

JON W. DUDAS
*Director of the United States Patent and Trademark Office*